United States Patent [19]

Hashimoto

[11] Patent Number: 5,668,027
[45] Date of Patent: Sep. 16, 1997

[54] METHOD OF MANUFACTURING A MOS TRANSISTOR SEMICONDUCTOR DEVICE

[75] Inventor: Masayuki Hashimoto, Tateyama, Japan

[73] Assignee: Nippon Steel Semiconductor Corporation, Tateyama, Japan

[21] Appl. No.: 268,325

[22] Filed: Jun. 30, 1994

Related U.S. Application Data

[62] Division of Ser. No. 945,895, Sep. 17, 1992, abandoned.

[30] Foreign Application Priority Data

Oct. 16, 1991 [JP] Japan .................................. 3-296306

[51] Int. Cl.$^6$ ............................................. H01L 21/336
[52] U.S. Cl. .................................. 438/305; 438/558
[58] Field of Search .............................. 437/44, 162, 34, 437/56, 57, 41

[56] References Cited

U.S. PATENT DOCUMENTS

| | | |
|---|---|---|
| 4,041,518 | 8/1977 | Shimizu et al. . |
| 4,353,085 | 10/1982 | Sakurai . |
| 4,735,916 | 4/1988 | Homma et al. ................ 437/162 |
| 4,822,754 | 4/1989 | Lynch et al. ................... 437/162 |
| 4,826,782 | 5/1989 | Sachitano et al. ............. 437/44 |
| 4,931,845 | 6/1990 | Ema . |
| 5,079,180 | 1/1992 | Rodder et al. ................. 437/162 |
| 5,113,234 | 5/1992 | Furuta et al. . |
| 5,168,072 | 12/1992 | Moslehi ......................... 437/162 |
| 5,314,832 | 5/1994 | Deleonibus ..................... 437/44 |
| 5,395,787 | 3/1995 | Lee et al. ..................... 437/162 |
| 5,547,885 | 8/1996 | Ogoh ............................ 437/162 |

FOREIGN PATENT DOCUMENTS

| | | | |
|---|---|---|---|
| 53-121580 | 10/1978 | Japan | ............... 437/162 |
| 57-89253 | 6/1982 | Japan | . |
| 57-196573 | 12/1982 | Japan | ............... 437/162 |
| 58-86771 | 5/1983 | Japan | . |
| 59-47768 | 3/1984 | Japan | . |
| 60-12772 | 1/1985 | Japan | ............... 437/162 |
| 2-2136 | 1/1990 | Japan | ............... 437/44 |

OTHER PUBLICATIONS

Wolf et al., *Silicon Processing for the VLSI Era; vol. 1: Process Technology*, Lattice Press, 1986, pp. 189–191, 320.
T.H. Ning, "Silicon–Gate MOSFET with Self–Aligned Buried Source and Drain Contacts", IBM Technical Disclosure Bulletin, vol. 23, No. 11, Apr. 1981, pp. 5190–5193.

*Primary Examiner*—Mary Wilczewski
*Attorney, Agent, or Firm*—Oliff & Berridge

[57] ABSTRACT

A MOS transistor semiconductor device has a gate electrode portion with a spacer film, diffused regions diffused with dopants, and element-separating regions. After the formation of the gate on the substrate, a spacer oxide is formed adjacent to the gate. A polysilicon layer doped with the same dopants as the diffused regions is formed between the element-separating regions and the spacer film. The polysilicon layer is overlaps portions of the gate electrode and the element-separating regions that are close to the diffused regions. Thermal diffusion of the dopants from the polysilicon layer to the substrate is performed to further dope the diffused regions. After an insulation layer is formed over the polysilicon layer, connection holes are formed through the insulation layer to connect the polysilicon layer to metal interconnects. In this MOS transistor, the polysilicon layer provides holes that are larger in diameter than holes at the openings of the diffused regions that are part of the substrate surface. Therefore, the area on the silicon substrate surface occupied by diffused layers is reduced to permit semiconductor elements to be packed at a high density. The resistances of interconnects are also suppressed.

25 Claims, 4 Drawing Sheets

METHOD OF MANUFACTURING A MOS TRANSISTOR SEMICONDUCTOR DEVICE

This is a Division of Application No. Ser. No. 07/945,895 filed Sep. 17, 1992, now abandoned.

BACKGROUND OF THE INVENTION

1. Field of the Invention

The present invention relates to a MOS transistor semiconductor device, particularly to the technique of connecting dopant-diffused regions with an interconnection layer and a method of manufacturing the same.

2. Description of the Prior Art

Conventionally, the connection between the dopant-diffused regions (hereinafter referred to as "diffused layer") of such as CMOS transistors and the interconnects is carried out, as shown in the forming steps of (a)–(f) of NMOS transistor illustrated in FIGS. 3(a) to 3(j) and PMOS transistor illustrated in FIGS. 4(a) to 4(j). IN Step (a), a partial field oxide film 11, a gate oxide film 12 and a gate polysilicon layer 13 are formed on the substrate, along with a masking while patterning a resist 15 is formed. In Step (b), the PMOS regions are masked with the resist 16 and the NMOS regions are doped with phosphorus. IN Step (c), a spacer oxide film 17 is formed on a gate electrode and In the manufacturing steps of CMOS transistor, PMOS regions and NMOS regions illustrated in FIGS. 3(a)–3(j) and FIGS. 4(a)–4(j) respectively, are treated simultaneously. IN Step (d), an oxide film 30 is formed. In Step (e), the PMOS regions are masked with the resist 161 and the NMOS regions are doped with arsenic to form N-type dopant regions. In Step (f), the NMOS regions are masked with resist 162 and the PMOS regions are doped with boron to form P-type dopant regions. In Step (g), a BPSG film is deposited. In Step (h), in order to make the BPSG film as an interlayer-insulating film 2, a reflow process is carried out with a high temperature treatment, so that a surface is flattened. Subsequently, in Step (i), the interlayer-insulating film 2 deposited on the diffused layers 1 and a metal interconnect material 3 are etched. The etching is made to go to the upper surfaces of the diffused layers which open to the substrate, thus forming connection holes 4. To ensure that the connection holes 4 are located within the openings in the diffused layers 1, the size D of each opening in the diffused layers is set larger than the diameter d of each connection hole 4. The spaces between them are known as alignment margins 5. In this way, both are connected.

Accordingly, the alignment margins make the diffused regions have excessive area. As a result, the area occupied by MOS transistors on a silicon substrate surface increases. This presents a problem in packing semiconductor devices at a higher density.

In view of the foregoing situations, it is an object of the present invention to provide a MOS transistor semiconductor device which reduces the area on the surface of the silicon substrate occupied by diffused layers, permits semiconductor devices to be packed at a higher density, and suppresses the resistances of interconnects. Also, it is another object of the invention to provide a method of manufacturing such a MOS transistor semiconductor device.

SUMMARY OF THE INVENTION

To achieve the above-described objects, the present invention offers a MOS transistor semiconductor device having a gate electrode portion, dopant-diffused regions, and circuit element-separating regions. The gate electrode portion has a spacer-insulating film. In this MOS transistor semiconductor device, a polysilicon layer is doped with the same dopants as the dopants diffused in the dopant-diffusion regions and is made of a conductive material between each dopant-diffused region and interconnects. The dopant-diffused regions have openings which open to the surface of the substrate. The polysilicon layer extends on and around those portions of the gate electrode portion and of the circuit element-separating regions which are close to the diffused regions such that the polysilicon layer spreads beyond the openings in the diffused regions. Connection holes are formed in an insulating film which overlies the polysilicon layer. The interconnects are formed in the connection holes.

In a method of manufacturing this, a gate electrode portion having a spacer-insulating film and circuit element-separating regions are formed on the surface of a silicon substrate. Polysilicon doped with dopants are deposited on the whole laminate. The polysilicon layer will become dopant-diffused regions. The polysilicon layer is patterned on those portions of the gate electrode portion and of the circuit element-separating regions which are close to the diffused regions such that the polysilicon layer spreads beyond openings in the diffused regions which open to the surface of the substrate. All insulating film is deposited on this laminate. Then, the laminate is thermally treated. In this step, the dopants are diffused into the laminate while using the polysilicon layer as a diffusant source, to form the diffused regions. Connection holes are formed in the insulating film overlying the polysilicon layer. Conductive interconnects are formed.

In accordance with the present invention, the implantation of dopants into the diffused regions does not rely on direct implantation of ions but utilizes thermal diffusion from the overlying polysilicon layer. Therefore, the diffused layer junction can be made shallow. Crystal defects can be prevented.

The polysilicon layer doped with the same dopants as the dopants in the diffused regions is made of a conductive material and in contact with the upper surfaces of the diffused regions. The polysilicon layer is patterned in such a way that it spreads on and around the gate electrode portion and the circuit element-separating regions. Therefore, connection holes are formed not directly in the diffused regions but on the upper surface of the polysilicon layer. Thus, it is possible to form alignment margins in the polysilicon layer whose two-dimensional area can be set independent of the diffused regions. It follows that the area occupied by the diffused regions is reduced according to the alignment margins.

DESCRIPTION OF PREFERRED EMBODIMENT

Figure 1A:
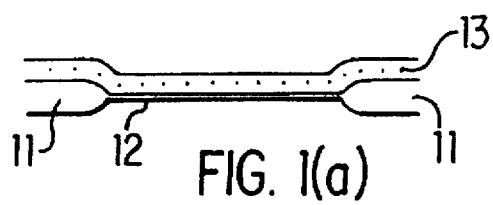
FIGS. 1(a)–1(j) are vertical sectional views of an NMOS transistor according to the present invention, for illustrating successive steps for manufacturing the transistor.
Figure 1B:
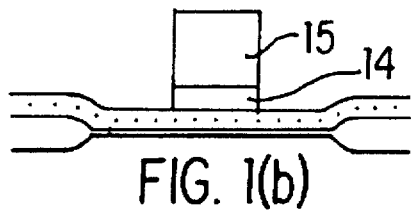
Figure 1C:
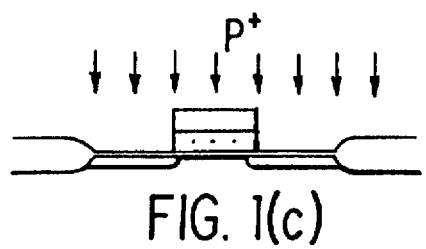
Figure 1D:
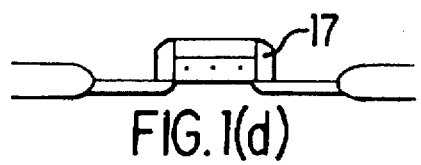
Figure 1E:
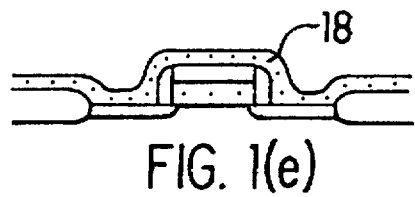

CMOS transistors to which the present invention is applied are next described as an embodiment of the invention by referring to the drawings.

FIGS. 1(a)–1(j) shows successive steps (a)–(j) for manufacturing an NMOS transistor and FIGS. 2(a)–2(j) shows similar successive steps (a)–(j) for manufacturing a PMOS transistor.

In Step (a), a partial field oxide film 11, which is formed by the LOCOS method acts as circuit element-separating regions. A gate oxide film 12 and a gate polysilicon layer 13 are formed. The gate polysilicon layer 13 on the oxide films 11 and 12 has a thickness of 2000 Å and is doped with phosphorus.

In Step (b), a gate cap oxide film ($SiO_2$) 14 having a thickness of 2000 Å is deposited on the gate polysilicon layer 13 and the gate oxide film 12. Furthermore, resist 15 is deposited. Then, a patterning step is carried out to remove the gate polysilicon layer 13 not protected by the resist 15.

Figure 2A:
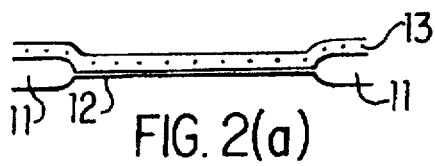
FIGS. 2(a)–2(j) are vertical sectional views of a PMOS transistor according to the present invention, for illustrating successive steps for manufacturing the transistor.
Figure 2B:
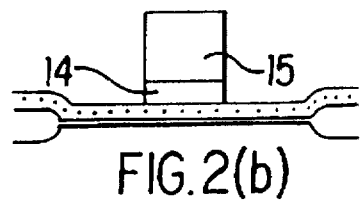
Figure 2C:
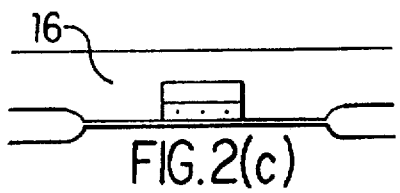
Figure 2D:
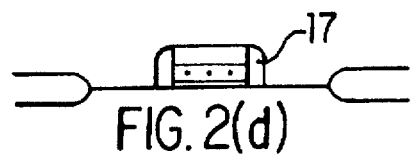
Figure 2E:
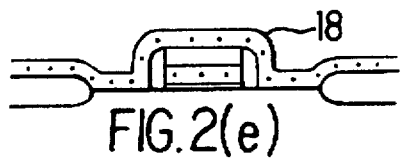

In Step (c), a resist 16 is deposited on the layer of the PMOS regions to form a mask (FIG. 2(c)). Subsequently, LDD implantation is carried out at $1 \times 10^{13}$ atoms/cm² for the NMOS regions FIG. 1(c). Then, a spacer oxide film 17 is deposited on the whole surfaces of those regions.

In Step (d), on the whole surfaces of those regions a LDD spacer-insulating film 17 are deposited. In Step (e), a polysilicon layer 18 is deposited on the gate electrode portion and on the partial field oxide film to a thickness of 500 to 3000 Å, e.g., 2000 Å.

Figure 1F:
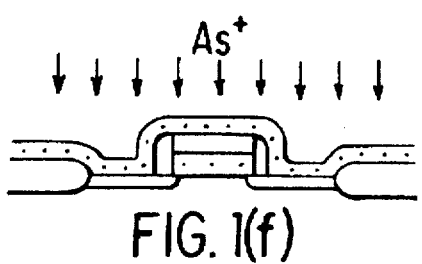
Figure 1G:
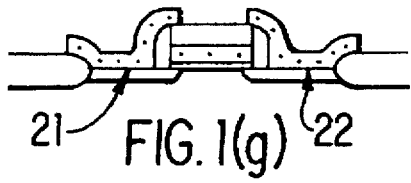
Figure 1H:
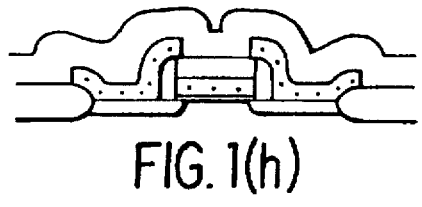
Figure 1I:
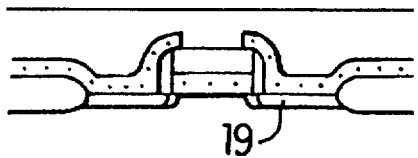
Figure 1J:
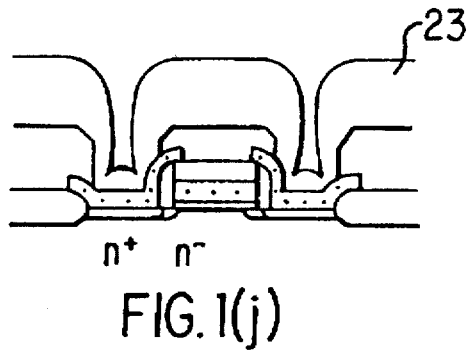
Figure 2F:
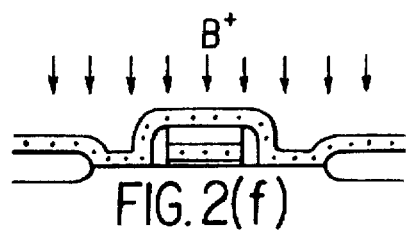
Figure 2G:
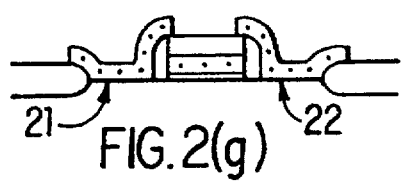
Figure 2H:
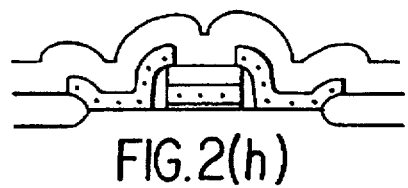
Figure 2I:
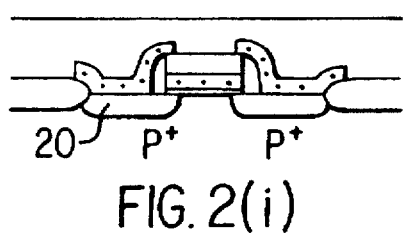

In Step (f), ions of arsenic (As) are implanted onto the polysilicon layer 18 at $1 \times 10^{16}$ atoms/cm² for the NMOS with PMOS region masked (see FIG. 1(f), and for the PMOS with the NMOS region masked, ions of boron (B) are implanted into the polysilicon layer 18 at $5 \times 10^{15}$ atoms/cm² (see FIG. 2(f)).

In Step (g), for both NMOS and PMOS, the polysilicon layer 18 is patterned on and around the upper surfaces of those portions of the gate electrode portion (gate cap oxide film 14) and of the partial field oxide film 11 which become diffused layers 19 and 20, to form holes larger than openings 21 and 22 in these portions that open to the silicon substrate surface.

In Step (h), BPSG is deposited.

In Step (i), a planarizing step is carried out at a temperature of 920° C. for 30 minutes. Arsenic and boron are thermally diffused from the polysilicon layer through the openings 21 and 22 to form the N-type diffused layer 19 and the P-type diffused layer 20.

Figure 2J:
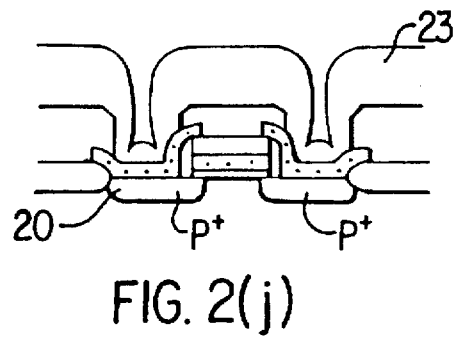
Figure 3A:
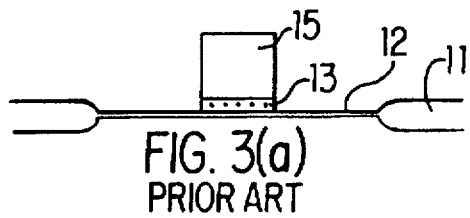
FIGS. 3(a)–3(j) are vertical sectional views of a conventional NMOS transistor similar to 1(a)–1(j) for illustrating its wiring connection with diffusion layers.
Figure 3B:
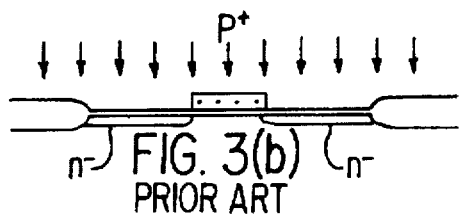
Figure 3C:
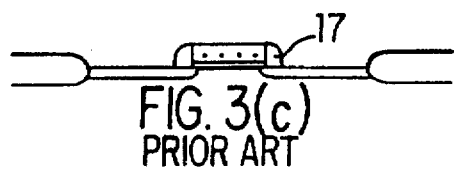
Figure 3D:
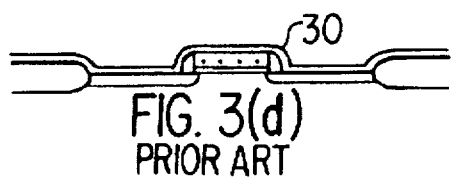
Figure 3E:
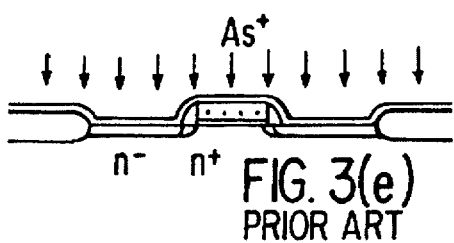
Figure 3F:
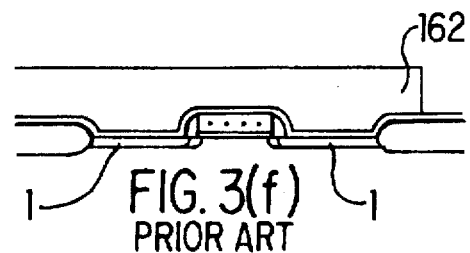
Figure 3G:
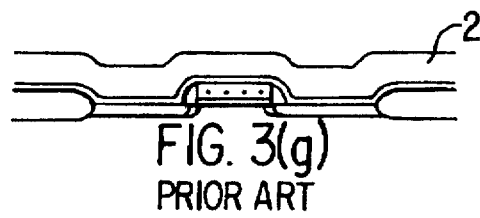
Figure 3H:
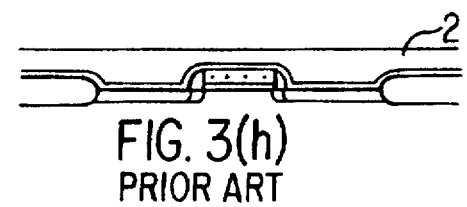
Figure 3I:
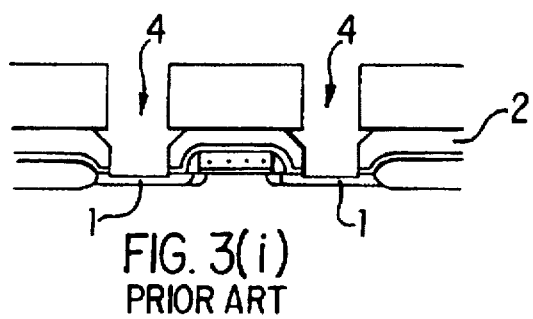
Figure 3J:
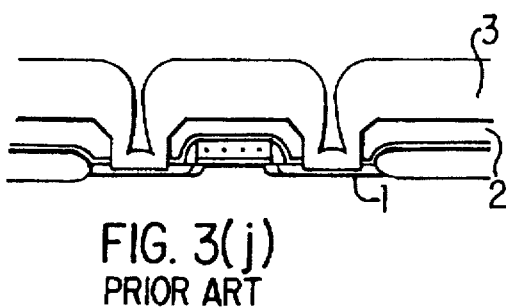
Figure 4A:
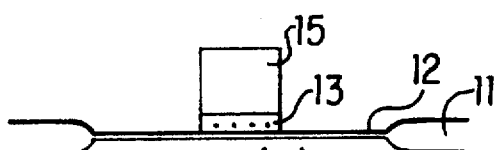
FIGS. 4(a)–4(j) are vertical sectional views of a conventional PMOS transistor similar to FIGS. 2(a)–2(j) for illustrating its wiring connection with diffusion layers.
Figure 4B:
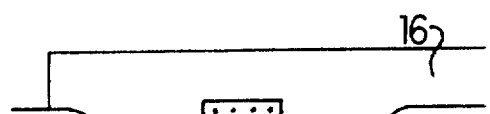
Figure 4C:
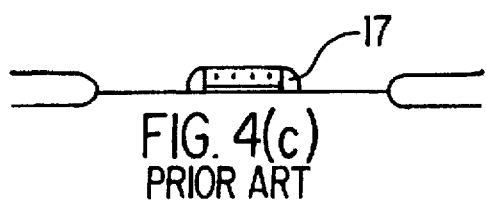
Figure 4D:
Figure 4E:
Figure 4F:
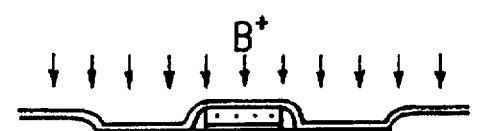
Figure 4G:
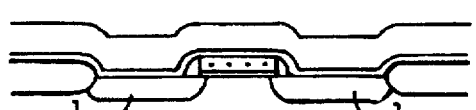
Figure 4H:
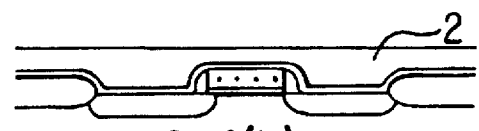
Figure 4I:
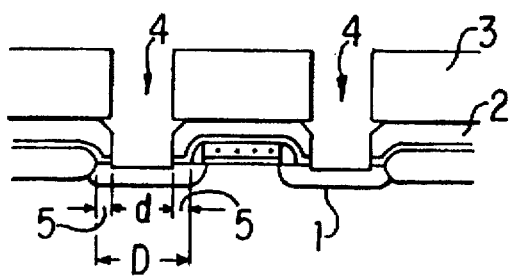
Figure 4J:
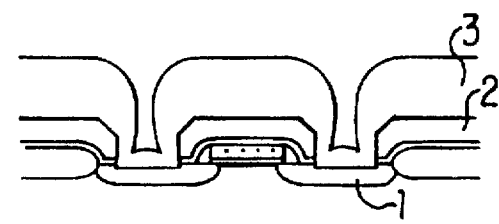

In Step (j), in the same way as in the prior art example of FIG. 2(j), aluminum 23 for interconnects is deposited. Connection holes are formed. The aluminum 23 is made to reflow. In this way, contact with the polysilicon layer is made. As a result, interconnects are formed.

In this case, if the patterning step is executed while appropriately enlarging the area of the polysilicon layer, it is possible to make the connection holes larger than those of the prior art example.

The dopant ions implanted into the polysilicon layer are thermally diffused such that more than half of them are left in the polysilicon. The dose of arsenic in the polysilicon layer for the NMOS is 2E20 to 8E20 atoms/cm². The dose of arsenic in the diffused layer is approximately 1E20 to 3E20 atoms/cm². The dose of boron in the polysilicon layer is approximately 8E19 to 2E20 atoms/cm². The dose of boron in the diffused layer is approximately 4E19 to 9E19 atoms/cm².

According to the present invention, dopant ions are implanted into the diffused layers not by direct ion implantation but by thermal diffusion from the polysilicon layer formed on the diffused layers. Therefore, the contact holes in the MOS transistor are only required to be aligned with the polysilicon layer having a larger area than the diffused layers. Consequently, the function of the alignment margins can be enhanced while reducing the area occupied by the diffused layers to a minimum. Hence, the densification of the semiconductor device can be enhanced.

At the same time, the junction area of the diffused layers can be reduced. This leads to a reduction in the parasitic capacitance of the transistors. Thus, the performance can be enhanced.

Further, instead of the diffused layers of the MOS transistor, contact holes can be formed in the polysilicon layer which is in contact with the diffused layers and consists of a conductive material. The area of the polysilicon layer can be appropriately enlarged. Thus, the diameters of the connection holes can be made larger than those of conventional devices. In consequence, the resistances of the interconnects including contact resistances can be suppressed.

What is claimed is:

1. A method of manufacturing a MOS transistor semiconductor device having a gate electrode portion, dopant-diffused regions, and circuit element-separating regions, the gate electrode portion having a spacer-insulating film, a gate polysilicon layer and a gate cap oxide film formed on the gate polysilicon layer, said method comprising the steps of:

forming the gate electrode portion of the MOS transistor semiconductor device and the circuit element-separating regions on a substrate surface of a silicon substrate, a separation region at the substrate surface separating the gate electrode portion and the circuit element-separating regions;

depositing a polysilicon layer and doping the polysilicon layer with dopants onto the gate electrode portion, the separation region, and the circuit element-separating regions, the polysilicon becoming part of the dopant-diffused regions at the separation region;

patterning and removing the polysilicon layer after doping the layer from portions of the gate electrode portion and the circuit element-separating regions, the polysilicon layer remaining in the dopant-diffused regions and spreading onto the gate electrode portion, onto an upper surface of the spacer-insulating film and onto a part of the gate cap oxide film and onto a part of the circuit element-separating region;

depositing an insulating film on the semiconductor device;

thermally treating the semiconductor device to diffuse the dopants into the substrate surface in contact with the polysilicon layer, the polysilicon layer being a diffusant source to form diffused regions at the substrate surface, the step of thermally treating planarizes the surface of the semiconductor device;

removing the insulating film on a part of the polysilicon layer to form connection holes; and forming conductive interconnects in the connection holes.

2. The method of claim 1, wherein the step of depositing the polysilicon layer comprises the steps of:

depositing an undoped layer of polysilicon on the gate electrode portion, the separation region and the circuit element-separating regions; and implanting dopants to a predetermined concentration into the polysilicon layer.

3. The method of claim 2, wherein a thickness of the polysilicon layer is between 500 Å and 3000 Å.

4. The method of claim 3, wherein the dopant used is arsenic to form NMOS transistors.

5. The method of claim 4, wherein the predetermined concentration of arsenic is $1\times10^{16}$ atoms/cm$^2$.

6. The method of claim 3, wherein the dopant used is boron to form PMOS transistors.

7. The method of claim 6, wherein the predetermined concentration of boron is $5\times10^{15}$ atoms/cm$^2$.

8. The method of claim 1, wherein phosphorus is implanted into the separation region to form NMOS regions, the phosphorus is implanted before forming the spacer-insulating film of the gate electrode portion.

9. The method of claim 8, wherein the phosphorus is implanted at a concentration of $1\times10^{13}$ atoms/cm$^2$.

10. The method of claim 8, wherein the implantation is performed using a LDD implantation method.

11. The method of claim 1, wherein the step of depositing the insulating film uses a BPSG method.

12. The method of claim 1, wherein the conductive interconnects are aluminum.

13. A method of manufacturing NMOS transistor semiconductor devices having a gate electrode portion, diffused regions, and circuit element-separating regions formed on a substrate, the method comprising the steps of:

forming a gate electrode portion and circuit element-separating regions on a substrate surface of the substrate, the gate electrode portion and the element-separating portions being separated by an exposed portion of the substrate surface;

forming a gate oxide cap film on the gate electrode portion;

implanting a first dopant into the exposed portion of the substrate surface;

forming a spacer-insulating film at an edge of the gate electrode portion and on a portion of the exposed portion of the substrate surface;

depositing a polysilicon layer on the NMOS transistor;

implanting a second dopant into the polysilicon layer, a diffused region being formed where the exposed portion is in contact with the polysilicon layer;

removing the doped polysilicon layer from a portion of the gate electrode portion and from a portion of the circuit element-separating regions, the doped polysilicon layer remaining in the diffused region and spreading onto the gate electrode portion, onto an upper surface of the spacer-insulating film and onto a part of the gate cap oxide film and onto a part of the circuit element-separating region;

depositing an insulating film on the NMOS transistor;

thermally treating the NMOS transistor to planarize the insulating film and to diffuse the dopant into the substrate, the polysilicon layer being a diffusant source to form the diffused regions at the substrate surface that is contacting the polysilicon layer;

forming connection holes by removing the insulating film on a part of the polysilicon layer of the diffused regions; and forming conductive interconnects in the connection holes.

14. The method of claim 13, wherein the first dopant is phosphorus.

15. The method of claim 14, wherein the phosphorus is implanted at a concentration of $1\times10^{13}$ atoms/cm$^2$.

16. The method of claim 13, wherein the implantation of the first dopant uses an LDD implantation method.

17. The method of claim 13, wherein the second dopant is arsenic.

18. The method of claim 17, wherein the arsenic is implanted at a concentration of $1\times10^{16}$ atoms/cm$^2$.

19. The method of claim 13, wherein the step of depositing the insulating film uses a BPSG method.

20. The method of claim 13, wherein the conductive interconnects are aluminum.

21. A method of manufacturing PMOS transistor semiconductor devices having a gate electrode portion, diffused regions, and circuit element-separating regions formed on a substrate, the method comprising the steps of:

forming a gate electrode portion and circuit element-separating regions on a substrate surface of the substrate, the gate electrode portion and the element-separating portions being separated by an exposed portion of the substrate surface;

forming a gate oxide cap film on the gate electrode portion;

forming a spacer-insulating film at an edge of the gate electrode portion and on a portion of the exposed portion of the substrate surface;

depositing a polysilicon layer on the PMOS transistor;

implanting a dopant into the polysilicon layer, a diffused region being formed where the exposed portion is in contact with the polysilicon layer;

removing the doped polysilicon layer from a portion of the gate electrode portion and from a portion of the circuit element-separating regions, the doped polysilicon layer remaining in the diffused region and spreading onto the gate electrode portion, onto an upper surface of the spacer-insulating film and onto a part of the gate cap oxide film and onto a part of the circuit element-separating region;

depositing an insulating film on the PMOS transistor;

thermally treating the PMOS transistor to planarize the insulating film and to diffuse the dopant into the substrate, the polysilicon layer being a diffusant source to form the diffused regions at the substrate surface that is contacting the polysilicon layer;

forming connection holes by removing the insulating film on a part of the polysilicon layer of the diffused regions; and forming conductive interconnects in the connection holes.

22. The method of claim 21, wherein the dopant is boron.

23. The method of claim 22, wherein the concentration of boron is $5\times10^{15}$ atoms/cm$^2$.

24. The method of claim 21, wherein the step of depositing the insulating film uses a BPSG method.

25. The method of claim 21, wherein the conductive interconnects are aluminum.

* * * * *